United States Patent
Jander

(10) Patent No.: US 11,404,845 B2
(45) Date of Patent: Aug. 2, 2022

(54) LIGHT-EMITTING DEVICE

(71) Applicant: OSRAM OLED GmbH, Regensburg (DE)

(72) Inventor: Peter Jander, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 155 days.

(21) Appl. No.: 16/757,056

(22) PCT Filed: Oct. 16, 2018

(86) PCT No.: PCT/EP2018/078237
§ 371 (c)(1),
(2) Date: Apr. 17, 2020

(87) PCT Pub. No.: WO2019/076890
PCT Pub. Date: Apr. 25, 2019

(65) Prior Publication Data
US 2020/0343686 A1   Oct. 29, 2020

(30) Foreign Application Priority Data
Oct. 17, 2017 (DE) ............. 10 2017 124 147.7

(51) Int. Cl.
*H01S 5/02255* (2021.01)
*H01S 5/02216* (2021.01)
(Continued)

(52) U.S. Cl.
CPC .......... *H01S 5/02255* (2021.01); *H01S 5/023* (2021.01); *H01S 5/0233* (2021.01);
(Continued)

(58) Field of Classification Search
CPC ...... H01S 5/0235; H01S 5/022; H01S 5/0064; H01L 23/02
See application file for complete search history.

(56) References Cited

U.S. PATENT DOCUMENTS 9,634,466 B2 *  4/2017  Kim ................. H01S 5/141
2013/0208465 A1 *  8/2013  Ge ................. H04N 9/3194
362/231

(Continued)

FOREIGN PATENT DOCUMENTS

DE    102004028117 A1    5/2005
DE    102015105807 A1    10/2016
(Continued)

OTHER PUBLICATIONS

International Search Report and Written Opinion in corresponding International Application No. PCT/EP2018/078237 dated Jan. 22, 2019, 13 pages.

Primary Examiner — Tuan N Nguyen
(74) Attorney, Agent, or Firm — MH2 Technology Law Group LLP

(57) ABSTRACT

A light-emitting device (100) is specified, which has a housing (1) with a mounting surface (12) and a housing recess (13), a semiconductor laser diode (2) being arranged in the housing recess, which is intended and embodied to emit laser light (20) in a direction parallel to the mounting surface (12) during operation, an optical element (4) being arranged downstream of the semiconductor laser diode in the beam path of the laser light, the semiconductor laser diode being mounted in the housing in such a way that the laser light has a maximum divergence in a plane parallel to the mounting surface, the optical element having a light-incoupling surface (41), exactly one reflector surface (42) and a light-outcoupling surface (43), the optical element being a one-piece housing cover which completely covers the housing recess in which the semiconductor laser diode is arranged, and the light-outcoupling surface being part of an outer surface of the optical element opposite the mounting surface.

14 Claims, 5 Drawing Sheets

Figure 2:
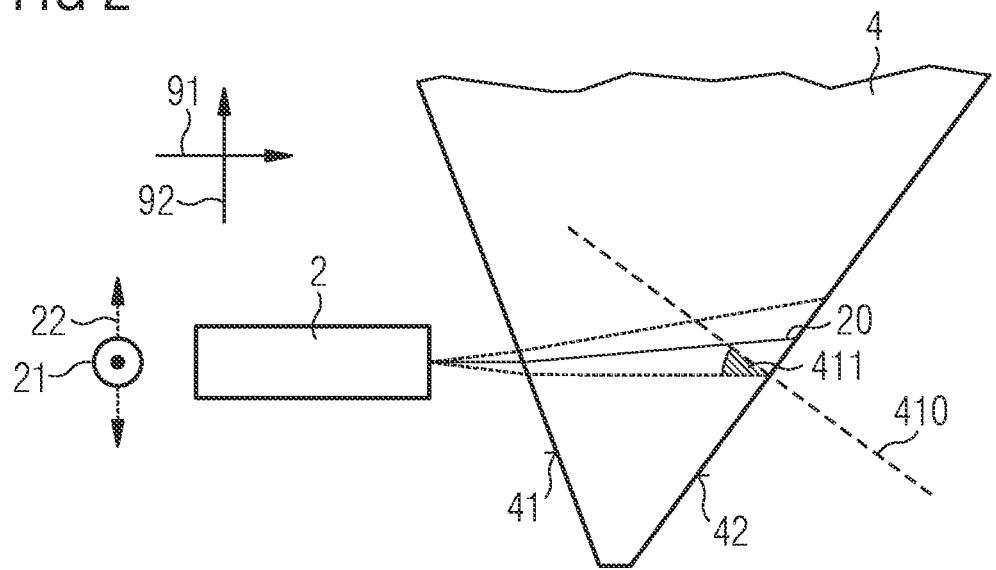

(51) Int. Cl.
*H01S 5/023* (2021.01)
*H01S 5/0233* (2021.01)
*H01S 5/02257* (2021.01)
*H01S 5/0235* (2021.01)

(52) U.S. Cl.
CPC ........ *H01S 5/0235* (2021.01); *H01S 5/02216* (2013.01); *H01S 5/02257* (2021.01)

(56) References Cited

U.S. PATENT DOCUMENTS

| | | |
|---|---|---|
| 2016/0285233 A1* | 9/2016 | Victoria .............. H01S 5/02315 |
| 2017/0126323 A1 | 5/2017 | Gudeman |
| 2017/0280031 A1* | 9/2017 | Price .................... G01S 7/4814 |

FOREIGN PATENT DOCUMENTS

| | | | |
|---|---|---|---|
| DE | 102016107715 A1 | 10/2017 | |
| JP | 2017212390 A | 11/2017 | |

\* cited by examiner

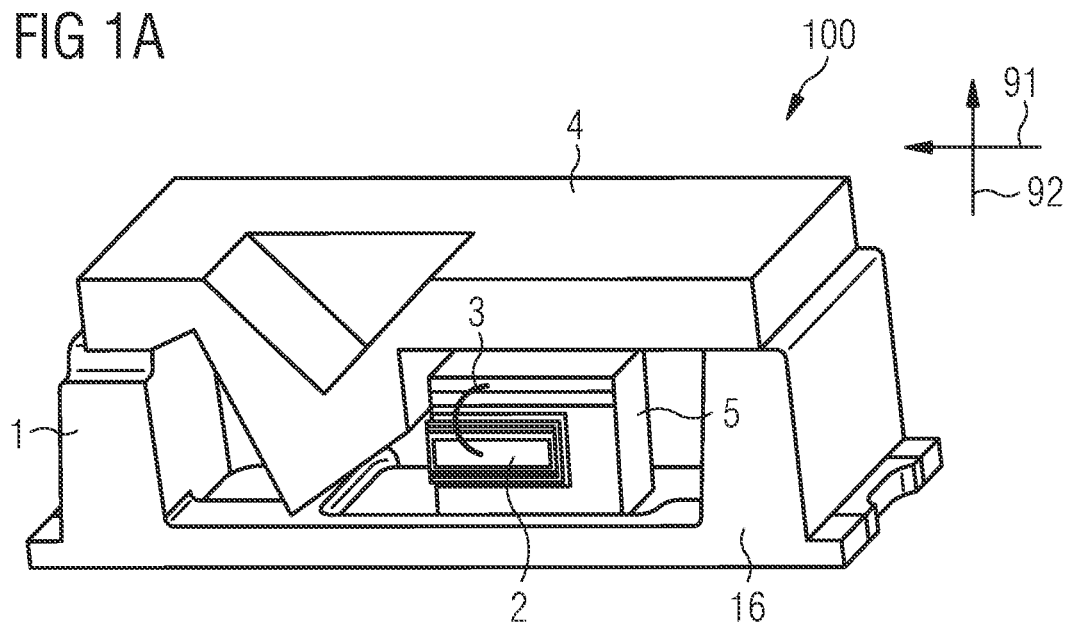
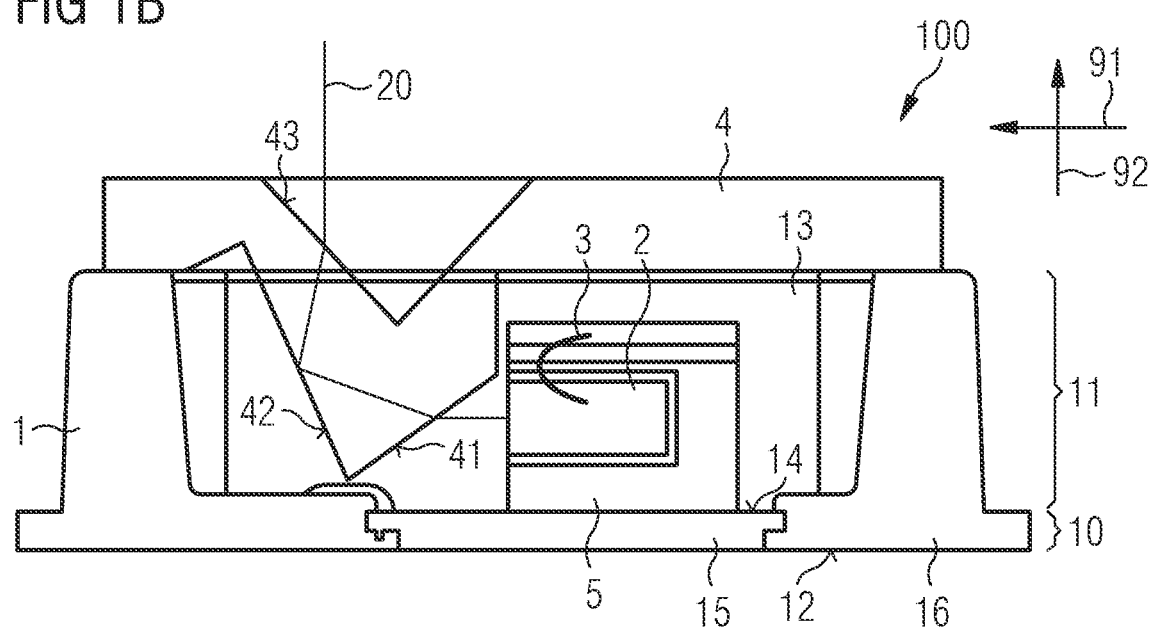

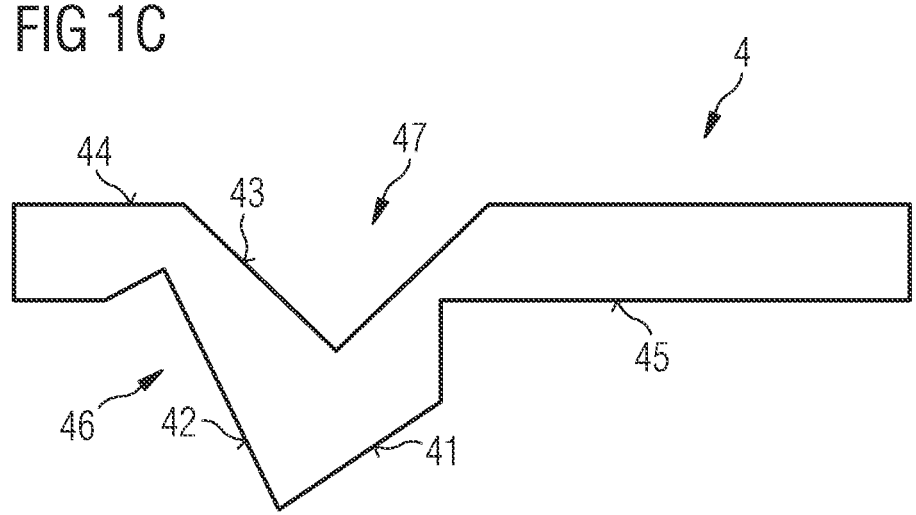
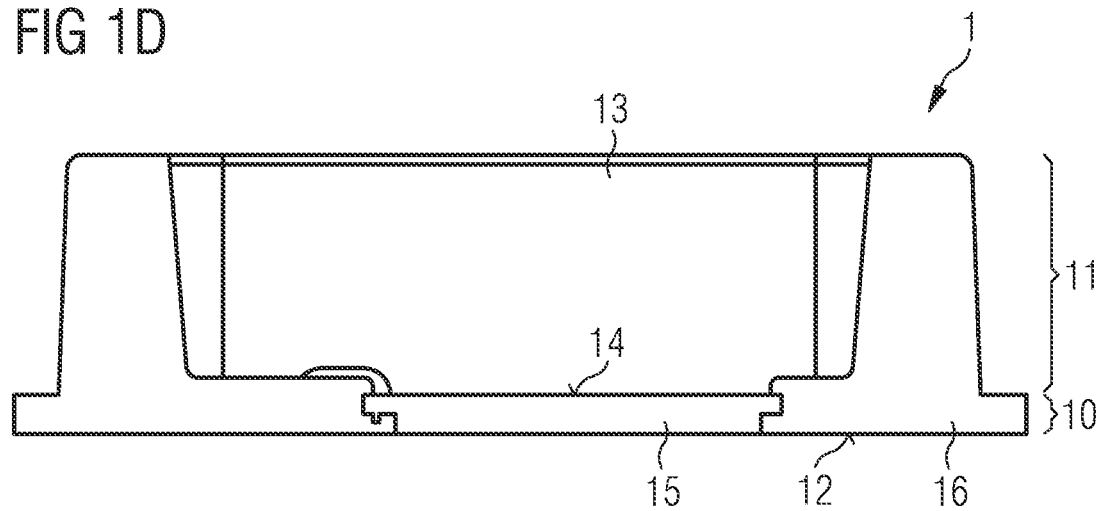

LIGHT-EMITTING DEVICE

CROSS-REFERENCE TO RELATED APPLICATION(S)

This application is a national stage entry from International Application No. PCT/EP2018/078237, filed on Oct. 16, 2018, published as International Publication No. WO 2019/076890 on Apr. 25, 2019, and claims priority under 35 U.S.C. § 119 from German Patent Application No. 102017124147.7, filed on Oct. 17, 2017, the entire contents of all of which are incorporated herein by reference.

A light-emitting device is specified.

This patent application claims the priority of the German patent application 10 2017 124 147.7, the disclosure content of which is hereby included by reference.

Laser radiation is used today for a wide range of applications. For example, infrared light-emitting laser diodes are used in procedures for distance measurement, such as time-of-flight (TOF) procedures. This also includes procedures known as LIDAR ("light detection and ranging"), which are used both for optical distance and speed measurement and for remote measurement of atmospheric parameters, as well as so-called "structured light" procedures, for example for scanning three-dimensional objects and for adjusting a camera focus. In such applications, laser diode-containing components are preferred, which allow an radiation emittance preferably perpendicular to a component mounting plane. Since the laser diodes are mounted parallel to the mounting plane in the known components with regard to their usual layer structure, at least one deflection optic is required in each case, which deflects the laser beam, which is also emitted parallel to the mounting plane, in the vertical direction. For this purpose, more or less complicated deflection optics are known, which generate or maintain the desired beam properties, for example with regard to polarization, by means of several deflection steps.

At least one object of particular embodiments is to provide a light-emitting device with a semiconductor laser diode.

This object is achieved by a subject-matter according to the independent claim. Advantageous embodiments and developments of the subject-matter are characterized in the dependent claims, and are also disclosed by the following description and the drawings.

According to at least one embodiment, a light-emitting device comprises a semiconductor laser diode. The semiconductor laser diode, which may be embodied in particular as a laser diode chip, is intended and embodied to emit, during operation, light that is laser light at least when certain threshold conditions are exceeded. In the following, for the sake of simplicity the semiconductor laser diode is described to emit laser light during operation.

According to a further embodiment, the semiconductor laser diode has at least one active layer, which is embodied and intended to generate light in an active region during operation. In particular, the active layer can be part of a semiconductor layer sequence comprising a plurality of semiconductor layers and have a main extension plane perpendicular to an arrangement direction of the layers of the semiconductor layer sequence. For example, the active layer can have exactly one active area. For a long-wave, infrared to red radiation, for example, a semiconductor layer sequence or at least one active layer based on $In_xGa_yAl_{1-x-y}$ As is suitable, for red to yellow radiation, for example, a semiconductor layer sequence or at least one active layer based on $In_xGa_yAl_{1-x-y}P$ is suitable, and for short-wave visible radiation, i.e., particularly in the range from green to blue light, and/or for UV radiation, for example a semiconductor layer sequence or at least one active layer based on $In_xGa_yAl_{1-x-y}N$ is suitable, wherein $0 \leq x \leq 1$, $0 \leq y \leq 1$ and $x+y \leq 1$ apply in each case.

Terms such as "vertical" or "parallel" can be used here and in the following to denote a precise vertical or parallel arrangement. Furthermore, vertical or parallel arrangements can also deviate from the exact arrangement by a small angle, which can be due to a manufacturing tolerance, for example, and which can be less than or equal to 10° or less than or equal to 5° or less than or equal to 3° or less than or equal to 1°.

According to a further embodiment, the semiconductor laser diode has an outcoupling side and a rear side opposite the outcoupling side. The outcoupling side and the rear side can be especially side surfaces of the semiconductor laser diode, especially preferred side surfaces of the semiconductor layer sequence, which can also be called facets. Via the facet on the outcoupling side, the semiconductor laser diode can emit the laser light generated in the active region during operation. Accordingly, the semiconductor laser diode can preferably be an edge-emitting semiconductor laser diode. Suitable optical coatings, in particular reflective or partially reflective layers or layer sequences, which can form an optical resonator for the light generated in the active layer, can be applied to the outcoupling side and the rear side.

According to a further embodiment, the light-emitting device has a housing with a mounting surface. In particular, the mounting surface can be an outer surface of the housing, by means of which the housing and thus the light-emitting device can be mounted on a suitable support. Directions parallel to the mounting surface are referred to here and in the following as lateral directions, directions perpendicular to the mounting surface as vertical directions.

Electrical contact of the light-emitting device via the mounting surface is particularly preferred. For this purpose, the housing can have suitable electrical connection regions which can form at least part of the mounting surface. Particularly preferred, the housing and thus the light-emitting device can be surface-mountable. For example, the housing can have a bottom element that has an outer surface that forms at least part of the mounting surface. The bottom element can comprise a printed circuit board, a lead frame, a ceramic substrate, especially with electrical contact regions, or similar components. The semiconductor laser diode can be located on a bottom surface opposite the mounting surface.

Furthermore, the housing can have a housing recess in which the semiconductor laser diode is located. The housing recess can in particular be formed by a wall element placed on the bottom element and surrounding a part of the bottom surface of the bottom element. The wall element can, for example, be formed at least partially by a plastic and/or ceramic material. In particular, the bottom element and the wall element can also form a coherent component and be manufactured in a joint process step. For example, the bottom element and the wall element can be formed by molding a lead frame with a plastic material.

According to a further embodiment, the semiconductor laser diode is arranged in the housing recess in such a way that the laser light is emitted by the semiconductor laser diode in a lateral direction, i.e., in a direction parallel to the mounting surface. In particular, the semiconductor laser diode can be mounted in the housing in such a way that the laser light has a maximum divergence in a plane parallel to the mounting surface. In the case of an edge-emitting semiconductor laser diode, this can mean that the so-called fast axis of the laser light is aligned parallel to the mounting surface. The arrangement direction of the semiconductor layers of the semiconductor laser diode is therefore also parallel to the mounting surface, so that the main extension planes of the semiconductor layers are parallel to the vertical direction. In other words, instead of the usual parallel mounting method the semiconductor laser diode in the light-emitting device described here is, with respect to the main extension plane of the semiconductor layers, preferably mounted perpendicular to the mounting surface, i.e., parallel to the vertical direction, respectively.

According to a further embodiment, the semiconductor laser diode is mounted on a carrier element. The carrier element is preferably mounted on the bottom surface of the housing. The carrier element can, for example, serve as a heat sink for the semiconductor laser diode and also as a heat conductor that can dissipate the heat generated during operation of the semiconductor laser diode to the bottom surface and thus to the housing. For example, the carrier element can include a ceramic component having a side surface for mounting the semiconductor laser diode and a bottom side perpendicular thereto for placement on the bottom surface of the housing. The carrier element can particularly preferred have an essentially cuboid shape. Furthermore, the carrier element can have electrical contact layers to which the semiconductor laser diode is electrically connected. The bottom surface of the housing can have two electrical contact regions and each of the contact layers of the carrier element can be electrically connected to one of the contact regions of the carrier element. The connection can be made, for example, via a wire connection. Furthermore, one or each of the contact layers of the carrier element can be mounted on one of the contact regions. For this purpose a solder connection can be used. The carrier element can have the contact layers on an edge or, particularly preferred, partially on its bottom side facing the bottom surface.

The side surface on which the semiconductor laser diode is mounted can be provided with a structured metallization in order to provide electrical contact surfaces for the semiconductor laser diode. The metallization can be structured in such a way that several electrically separated metal surfaces are in contact with the bottom edge of the side surface towards the bottom side as contact surfaces. The top side can be metallized to make bond wire connections. Alternatively, the top side can be non-metallized to make the production more cost-effective. The bottom side can be metallized as described above to ensure a secure electrical contact. Furthermore, the bottom side can also be non-metallized in order to make production more cost-effective. There can also be a groove in the bottom side that allows the carrier element to be fixed to electrically separate contact regions, even if there is a parting line between them that is not planar with the contact regions.

In case that the carrier element is embodied in such a way that electrically separated surfaces are in contact with the bottom edge of the side surface on which the semiconductor laser diode is mounted, no bond wire connection between the carrier element and the housing is necessary for the electrical connection of the semiconductor laser diode. On the one hand this can reduce the manufacturing effort, on the other hand it can reduce the minimum achievable pulse length for pulsed semiconductor laser diodes, since the electrical pulses are not widened by inductances of the bonding wires.

According to a further embodiment, the light-emitting device has an optical element which is arranged downstream of the semiconductor laser diode in the beam path of the laser light. The optical element has optically active surfaces, i.e., surfaces which, via one or more effects selected from light refraction, light diffraction and reflection, cause a change in the laser light with respect to its beam direction and/or other beam characteristics.

According to a further embodiment, the optical element is a one-piece housing cover. The housing cover can, particularly preferably completely, cover the housing recess, in which the semiconductor laser diode is located. In other words, the optical element simultaneously serves to influence the laser light as well as to cover the housing, so that the semiconductor laser diode is particularly well suited to be located in a closed interior space formed by the covered housing recess. The interior can be closed off by the housing and the housing cover in the form of the optical element, preferably in such a way that no harmful substances from the environment can reach the semiconductor laser diode. Furthermore, the expression "completely cover" here and in the following also includes the case where, for example, a ventilation opening remains due to a recess in the optical element and/or in the housing so that the housing is not hermetically sealed by the optical element. Since the optical element and the housing cover are formed by the same component, no additional housing cover is required in addition to the optical element. Furthermore, the optical element can be the only component of the light-emitting device to influence the laser light beam.

According to a further embodiment, the optical element has a light-incoupling surface, a reflector surface and a light-outcoupling surface. In particular, the optical element can have exactly one reflector surface in addition to the light-incoupling and light-outcoupling surfaces. The fact that the optical element has exactly one reflector surface means that the laser light is reflected within the optical element at exactly this only one surface of the optical element. In particular, the light-outcoupling surface can be part of an outer surface, formed by a top side, of the optical element opposite the mounting surface. The light-incoupling surface and the reflector surface can be parts of another outer surface of the optical element, which is faces the mounting surface and thus towards the housing recess and is formed by a bottom side.

During operation of the light-emitting component, the laser light can enter the optical element through the light-incoupling surface, be reflected at the reflector surface and, after reflection, exit the optical element through the light-outcoupling surface and be emitted by the light-emitting device in the desired direction. In particular, the light-incoupling surface and the light-outcoupling surface and in particular the reflector surface can each be inclined to the beam direction of the laser light in such a way that the laser light emerges from the optical element and thus from the light-emitting device in a direction substantially perpendicular to the mounting surface. "Substantially perpendicular" can mean an exactly perpendicular emission or an emission which deviates from an exactly perpendicular emission by an angle of less than or equal to 15° or less than or equal to 10° or less than or equal to 5° or less than or equal to 3°.

The light-outcoupling surface can be a part of a recess in the top side of the optical element facing away from the bottom surface of the housing. Furthermore, the light-incoupling surface can be a part of an elevation on the bottom side of the optical element facing the bottom surface of the housing and thus away from the top side. Furthermore, the reflector surface can also be a part of the elevation in the bottom side of the optical element. In particular, the light-incoupling surface, the reflector surface and the light-outcoupling surface can each be outer surfaces of the optical element. The recess in the top side can be arranged vertically above the elevation in the bottom side without lateral offset, so that the recess projects from the top side into the elevation projecting to the bottom surface of the housing.

According to a further embodiment, the optical element comprises a solid body made of a transparent material, which has outer surfaces forming the light-incoupling surface, the reflector surface and the light-outcoupling surface. The transparent material can, in particular, comprise or be made of a plastic such as silicone or epoxy or a glass. The solid body and thus the optical element can be particularly preferred to be free of any undercuts, so that the optical element can be easily manufactured by injection molding or other methods.

According to a further embodiment, at least one or more or all surfaces selected from the light-incoupling surface, the reflector surface and the light-outcoupling surface are not parallel or not perpendicular or neither parallel nor perpendicular to the mounting surface. In particular, the light-incoupling surface and the light-outcoupling surface can also be non-parallel and non-perpendicular to each other. Particularly preferred, the light-incoupling surface, the reflector surface and the light-outcoupling surface can be, in pairs, non-parallel and non-perpendicular to each other.

The light-incoupling surface, the reflector surface and the light-outcoupling surface can all be flat, non-curved surfaces. Furthermore, it can also be possible that at least one or more or all surfaces selected from the light-incoupling surface, the reflector surface and the light-outcoupling surface are curved. By a curvature of an optically active surface it is for example possible to influence the beam shape. Such a curvature can also form a lens shape, for example in the form of a Fresnel lens.

According to a further embodiment, the laser light is reflected at the reflector surface by total reflection. This can mean in particular that the reflector surface is inclined in relation to the beam direction of the laser light after its entry into the optical element through the light-incoupling surface in such a way that, if possible, the entire laser light, even taking into account beam divergence, is reflected, by total reflection at the reflector surface, in the direction of the light-outcoupling surface. In this case, the reflector surface can be embodied as a TIR surface (TIR: "total internal reflection"). As described above, the optical element can have a transparent material which preferably has a refractive index greater than or equal to 1.5. Furthermore, the transparent material can have a refractive index of less than or equal to 1.6. It is also possible that a reflective coating is applied to the reflector surface. In this way it can be achieved, for example, that the inclination of the reflector surface can be selected independently of the condition for total reflection.

According to a further embodiment, a diffractive structure is applied to at least one or more or all surfaces selected from the light-incoupling surface, the reflector surface and the light-outcoupling surface. Diffractive structures can be used especially for beam shaping.

According to a further embodiment, the light-incoupling surface and/or the light-outcoupling surface form a Brewster window. In other words, the light-incoupling surface and/or the light-outcoupling surface can be inclined at an angle to the path of the laser light to be incoupled or outcoupled, which corresponds to the Brewster angle. Alternatively, the light-incoupling surface can be inclined at an angle to the laser light that deviates from the Brewster angle. The deviation can be less than or equal to 10°, for example. By selecting the inclination of the light-incoupling surface to the beam path of the laser light, it can be adjusted whether and which part of the laser light is reflected at the light-incoupling surface.

The optical element described here can particularly preferred be substantially polarization-maintaining for the laser light. This can mean that the optical element is preferably perfectly polarization-maintaining or that a small influence on the polarization, which cannot be avoided due to manufacturing tolerances, for example, can occur due to the properties of the optical element. Furthermore, the light-incoupling surface, the reflector surface and the light-outcoupling surface can be the only optically active surfaces of the optical element.

According to a further embodiment, a light detector is arranged in the housing. The light detector can preferably be arranged in lateral direction between the semiconductor laser diode and the light-incoupling surface. For example, by selecting the appropriate inclination of the light-incoupling surface to the beam path of the laser light, as described above, a part of the laser light can be reflected from the light-incoupling surface onto the light detector.

An advantage of the light-emitting device described here is that the optical element can be manufactured in a simple manner, since it does not have to have an undercut. This means that, in addition to injection molding, other manufacturing processes can be used for the optical element. In addition, there are only three optically active surfaces, which keeps the production of the optical element simple and results in less beam distortion compared to optical elements with several reflective surfaces while maintaining the same quality of the optical surfaces.

Figure 3:
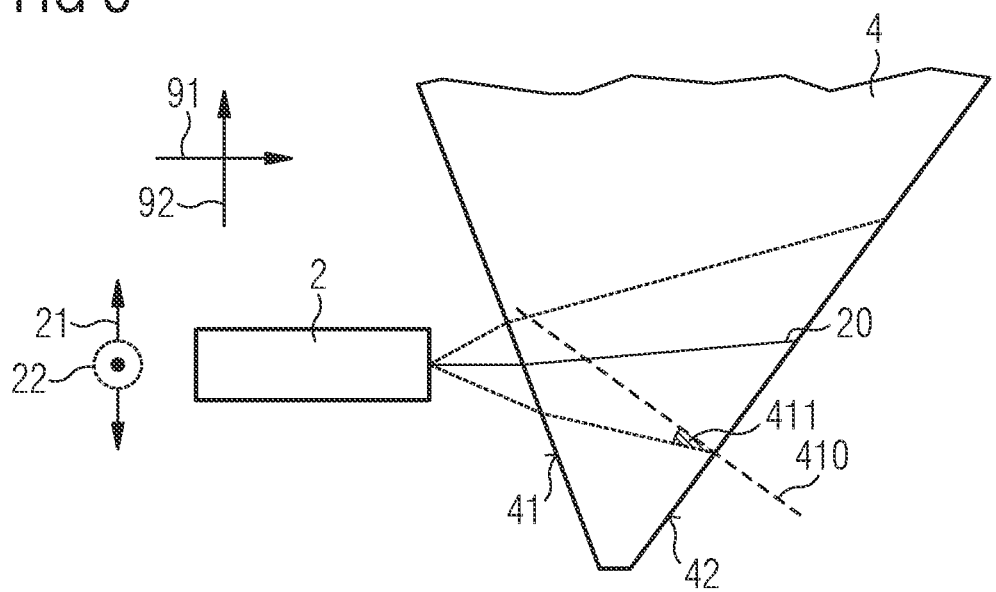
Figure 4:
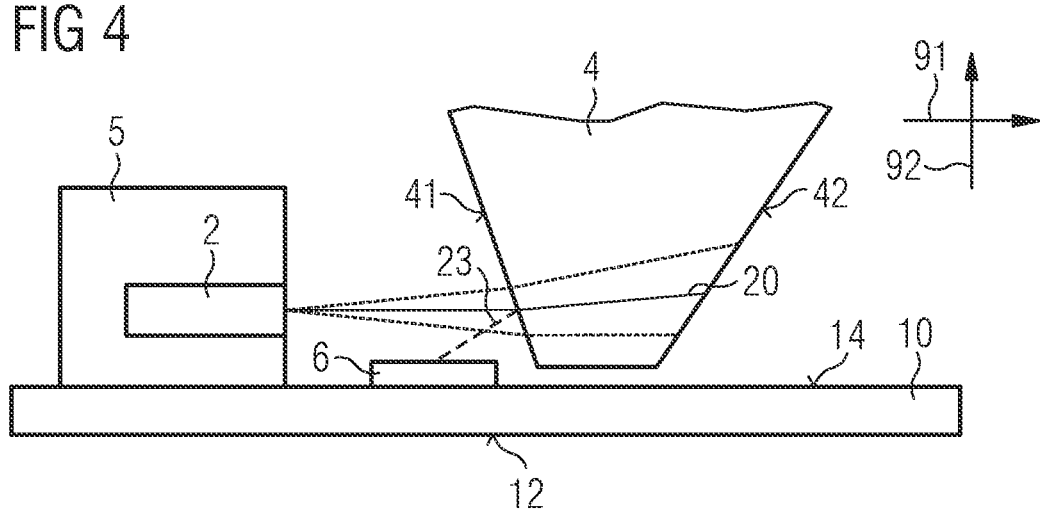
Figure 5:
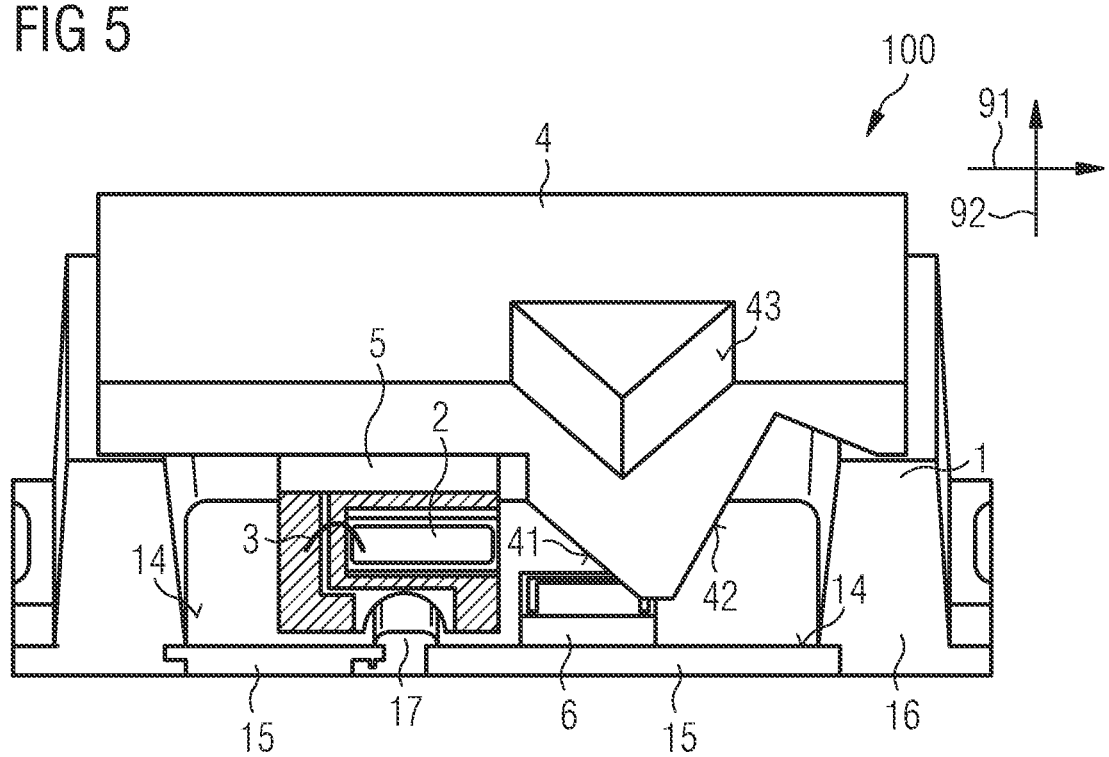

Further advantages, advantageous embodiments and further developments are revealed by the embodiments described below in connection with the figures, in which:

FIGS. 1A to 1D show schematic illustrations of a light-emitting device and parts thereof according to an embodiment, FIGS. 2 and 3 show schematic illustrations of parts of a light-emitting device according to a further embodiment and a comparative example, FIG. 4 show a schematic illustration of a part of a light-emitting device according to a further embodiment, FIG. 5 show a schematic illustration of a light-emitting device according to a further embodiment and FIGS. 6A to 6D show schematic illustrations of carrier elements of light-emitting devices according to further embodiments.

In the embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

FIGS. 1A to 1D show an embodiment for a light-emitting device 100 according to an embodiment. FIG. 1A shows a cut-away three-dimensional illustration of the device, while FIG. 1B shows a two-dimensional sectional view. FIGS. 1C and 1D show the optical element 4 and the housing 1 separately. The following description refers equally to FIGS. 1A to 1D.

The light-emitting device 100 has a housing 1 in which a semiconductor laser diode 2 in the form of a multimode laser diode chip is mounted. The semiconductor laser diode 2 in the embodiment shown is embodied as an edge-emitting semiconductor laser diode and emits laser light 20 during operation via an outcoupling facet, as indicated in FIG. 1B. For this purpose, as described in the general part, the semiconductor laser diode 2 has at least one active region which is a part of a semiconductor layer sequence with suitably selected semiconductor materials. The structure of semiconductor laser diodes is known to a person skilled in the art and will therefore not be discussed further here.

The light-emitting device 100 can be intended and embodied, for example, for use in TOF, LIDAR or S-L applications so that the laser light 20 can be infrared light, for example. Alternatively, other applications are also possible, for which the light-emitting device 100 and in particular the semiconductor laser diode 2, for example, can also be embodied to emit visible or ultraviolet light.

The housing 1 has a bottom element 10 and a wall element 11. The bottom element 10 has an outer surface which forms at least a part of a mounting surface 12 of the light-emitting device 100. Furthermore, the housing 1 has a housing recess 13, laterally surrounded by the wall element 11, with a bottom surface 14 opposite the mounting surface 12, on which the semiconductor laser diode 2 is arranged. As indicated in FIGS. 1A and 1B, directions parallel to the mounting surface 12 are referred to as lateral directions 91, while directions perpendicular to the mounting surface 12 are referred to as vertical directions 92.

With the mounting surface 12 the light-emitting device 100 can be mounted on an external carrier. In particular, the light-emitting device 100 can be surface-mountable. In the embodiment shown, the bottom element 10 has contact regions 15, which are formed by leadframe parts and which form 12 connection regions on the mounting surface for the electrical connection of the light-emitting device 100. Alternatively, the bottom element 10 can also comprise a printed circuit board or a ceramic substrate with electrical contact regions, for example.

Furthermore, the bottom element 10 as well as the wall element 11 in the embodiment shown comprise a housing material 16 in the form of a plastic with which the contact regions 15 are molded or which is molded onto the contact regions 15. The bottom element 10 and the wall element 11 in the embodiment shown are manufactured together and do not form separate housing components. Alternatively, the wall element can also be attached to a previously manufactured bottom element. Furthermore, it can also be possible that the wall element is at least partially formed by a part of the optical element 4 described below.

As can be seen in particular in FIG. 1B, the semiconductor laser diode 2 is arranged in the housing recess 13 in such a way that the laser light 20 is emitted by the semiconductor laser diode 2 in a lateral direction 91 and thus parallel to the mounting surface 12. In FIG. 1B, only the optical axis of the laser light 20 is indicated for the sake of clarity. In particular, the semiconductor laser diode 2 is mounted in the housing 1 in such a way that the laser light 20 has a maximum divergence in a plane parallel to the mounting surface 12. The direction with the maximum divergence is also called the fast axis, so that it this fast axis is aligned parallel to the mounting surface 12. To achieve this, the semiconductor laser diode 2 is mounted vertically. For this purpose, the light-emitting device 100 has a carrier element 5 with a lateral surface aligned perpendicular to the mounting surface 12, on which the semiconductor laser diode 2 is mounted and electrically connected. As indicated in FIGS. 1A and 1B, the electrical connection can be made by contact layers, wherein one of the contact layers can be electrically connected to the semiconductor laser diode 2 by means of a bonding wire 3.

The carrier element 5 is mounted on the bottom surface 14 of the housing 1 and can also serve as a heat sink and heat conductor for the heat generated in the semiconductor laser diode 2 in order to dissipate the heat to the bottom surface 14 and thus to the housing 1. For example, the carrier element 5 can have a ceramic component with a side surface for mounting the semiconductor laser diode 2 and a bottom surface perpendicular thereto for placement on the bottom surface 14 of the housing 1. As shown, the carrier element 5 can have an essentially cuboid shape, which is particularly preferred. The contact layers of the carrier element 5 are electrically conductively connected to the contact regions 15 of the housing, wherein this can be achieved by direct mounting on at least one of the contact regions 15 and/or by wire connections (not shown). Further features and embodiments of the carrier element 5 are described below, especially in connection with FIGS. 6A to 6D.

Furthermore, the light-emitting device 100 has an optical element 4, which is arranged downstream of the semiconductor laser diode 2 in the beam path of laser light 20. The optical element 4 forms a one-piece housing cover for the housing 1, wherein the housing recess 13 with the semiconductor laser diode 2 is completely covered and a closed interior is formed. The interior can be closed off by the housing 1 and the housing cover in the form of the optical element 4, preferably in such a way that no harmful substances from the environment can reach the semiconductor laser diode 2.

The optical element 4 comprises optically active surfaces, i.e., surfaces that can influence the laser light by refraction and/or diffraction and/or reflection. In particular, the optical element 4 has a light-incoupling surface 41, exactly one reflector surface 42 and a light-outcoupling surface 43. The light-outcoupling surface 43 is a part of an outer surface of the optical element 4 opposite the mounting surface 12 of the housing 1, formed by a top side 44, which at the same time forms an outer surface of the light-emitting device 100. The light-incoupling surface 41 and the reflector surface 42 are parts of a further outer surface of the optical element 4, which faces the mounting surface 12 and thus the housing recess 13 and is formed by a bottom side 45.

The optical element 4 is formed by a solid body of a transparent material. The transparent material can, in particular, comprise or be made of a plastic such as silicone or epoxy or a glass. As shown, the solid body can be particularly preferred to be free of any undercuts, so that the optical element 4 can be easily manufactured by injection molding or other methods.

The light-incoupling surface 41 and the reflector surface 42 are, as shown, part of an elevation 46 in the bottom side 45 of the optical element 4 facing the bottom surface 14 of the housing 1, while the light-outcoupling surface 43 is part of an indentation 47 in the top side 44 of the optical element 4 facing away from the bottom surface 14 of the housing 1. The indentation 47 in the top side 44 is arranged in the vertical direction 92 above the elevation 46 in the bottom side 45 without lateral offset, so that the indentation 47 projects into the elevation 46 from the top side 44.

The light-incoupling surface 41, the reflector surface 42 and the light-outcoupling surface 43 can all be flat, non-curved surfaces, as shown in the present embodiment. Furthermore, it can also be possible that at least one or more or all surfaces selected from the light-incoupling surface 41, the reflector surface 42 and the light-outcoupling surface 43 are curved. By a curvature of an optically active surface, for example, it is possible to influence the beam shape. Furthermore, a diffractive structure, which can also serve to shape the beam, can be applied to at least one or more or all surfaces selected from the light-incoupling surface 41, the reflector surface 42 and the light-outcoupling surface 43.

During operation of the light-emitting device 100, the laser light 20 enters the optical element 4 through the light-incoupling surface 41, is reflected at the one reflector surface 42 in the direction of the light-outcoupling surface 43, and is then coupled out of the optical element 4 and thus out of the light-emitting device 100 through the light-outcoupling surface 43. In the embodiment shown, the light-incoupling surface 41 and the light-outcoupling surface 43 each form a Brewster window. The light-incoupling surface 41 and the light-outcoupling surface 43 are therefore each inclined at an angle to the beam direction of the laser light 20 to be incoupled or outcoupled, which corresponds to the Brewster angle, so that as little reflection loss as possible occurs on these surfaces.

The reflector surface 42 is inclined in such a way that the laser light 20 emerges from the optical element 4 and thus from the light-emitting device 100 essentially in the vertical direction 92 perpendicular to the mounting surface 12. The reflector surface 42 is especially embodied as a TIR surface, so that the laser light 20 is directed by total reflection to the light-outcoupling surface 43.

Alternatively, it is also possible that a reflective coating is applied to the reflector surface 42. This makes it possible, for example, to ensure that the inclination of the reflector surface 42 can be selected independently of the condition for total reflection.

For the light-emitting device 100 described here, the fast axis, i.e., the direction of maximum beam divergence, of the laser light 20 is oriented parallel to the mounting surface 12 as described above. This is achieved by mounting the semiconductor laser diode 2 laterally on the carrier element 5 and installing this carrier element 5 in the housing 1 in such a way that the fast axis receives the desired alignment, i.e., preferably parallel to the mounting surface 12. Furthermore, as described, the optical element 4, which deflects the laser light beam in the desired vertical exit direction, is also used as a cover. The laser light 20 is deflected into the desired exit direction by a single reflection and, if necessary, by refraction at the light-incoupling surface and/or the light-outcoupling surface. The light incoupling and/or outcoupling surfaces can be tilted against the beam axis as described so that no or only a certain proportion of the light is reflected at the interfaces due to the Brewster effect. Alternatively, the light-incoupling surface 41 and/or the light-outcoupling surface 43 can also be coated to obtain the desired reflection properties. As described, the reflector surface 42 can be embodied in a particularly preferred way so that the reflection is caused by total internal reflection, which allows for cost-effective production. Alternatively, a metallic or dielectric coating can be used, which is advantageously no longer angularly restricted and can be insensitive to contamination.

FIG. 2 shows a part of the light-emitting device to illustrate some of its advantages. FIG. 3 shows a comparative example. The double arrows 21 indicate the fast axis and the double arrows 22 the slow axis of laser light 20. In FIG. 2, the fast axis and thus the direction of maximum divergence is oriented perpendicular to the drawing plane and thus parallel to a lateral direction 91 as described above, while the slow axis and thus the direction of minimum divergence is oriented vertically and thus parallel to the drawing plane. In the comparative example in FIG. 3, the fast axis and the slow axis are oriented rotated by 90° according to the usual arrangement of laser diodes. The solid lines of laser light 20 indicate the optical axis of the light beam, the dotted lines on both sides of laser light 20 indicate the respective divergence of the light beam.

In the comparative example in FIG. 3, the fast axis of laser light 20 as described lies in the plane defined by the beam axis and the surface normal 410 of the reflector surface 42. For total reflection, it is important that the angle of incidence 411 is larger than the critical angle for TIR, even for beams of maximum divergence. For practical designs, this requires that the refractive index of the optical element 4 is greater than about 1.60. In the case of the light-emitting device described here, the slow axis, i.e., the direction of minimum beam divergence, lies in the plane defined by the beam axis and the surface normal 410 of the reflector surface 42, as explained above. As a result, the minimum angle of incidence 411 is larger than in the case of the comparative example, so that transparent materials with a refractive index of less than or equal to 1.60 can also be used for the optical element in the light-emitting device described here. For example, the refractive index can also be greater than or equal to 1.50. In particular, it is possible, for example, to manufacture the optical element 4 from epoxy resin, silicone or glass, whereas in the comparative example only a few thermoplastics would be suitable.

Furthermore, the described optical element 4 is substantially polarization-maintaining, since the polarization direction of the laser light 20 is parallel to the normal 410 of the reflector surface 42 due to the described arrangement of the semiconductor laser diode 2, so that the laser light beam is not elliptically polarized by the TIR effect.

For the sake of clarity, only part of a light-emitting device is shown in FIG. 4 according to a further embodiment, which in comparison to the previous embodiment also has a light detector 6 in the form of a photodiode. All features not shown and not described in the following can be embodied as in the previous embodiment.

Since by mounting the semiconductor laser diode 2 by means of the carrier element 5 the light-emitting facet of the semiconductor laser diode 2 is mounted at a certain height while the beam divergence perpendicular to the mounting surface 12 is minimal, it is possible to mount the optical element 4 at a certain lateral distance from the semiconductor laser diode 2 without the laser light beam hitting the bottom surface 14 of the housing. Thus, a space is available to place the light detector 6 laterally between the semiconductor laser diode and the optical element as described above. In particular, the light detector 6 can be placed on the floor area 14 and electrically connected there.

By a suitable inclination of the light-incoupling surface 41, which can deviate from the Brewster angle, it can be achieved that a part 23 of the laser light 20 is not coupled into the optical element 4, but is reflected onto the light detector 6. Thus it can be possible to measure properties of laser light 20, such as power, pulse energy, pulse shape, pulse width, time of a pulse, wavelength, etc.

FIG. 5 shows a further embodiment of a light-emitting device 100, which also has a light detector 6 in comparison to the embodiment of FIGS. 1A to 1D. The angle of incoupling, i.e., the angle between the light-incoupling surface 41 and the beam axis of the laser light, can be 45°, for example, so that a small portion of the laser light 20 can be reflected vertically downwards onto the light detector 6. Furthermore, unlike in the embodiment of FIGS. 1A to 1D, the carrier element 5 is mounted on two contact regions 15.

The carrier element 5 has a groove on the bottom side so that the carrier element 5 can be positioned above the bulge 17, which is formed by overmolding the parting line between the contact regions 15. This means that no further electrical connection between the carrier element 5 and the housing 1 is necessary. Further features of the carrier element 5 are described in connection with the following figures.

Figure 6A:
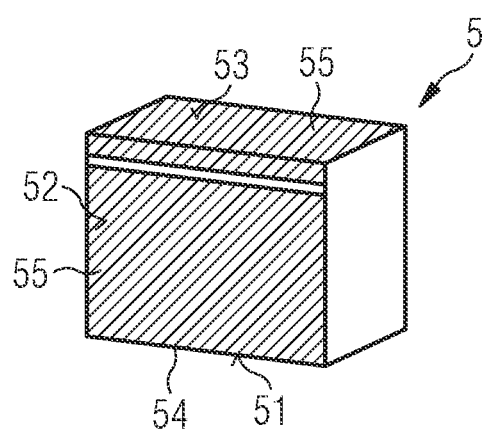
Figure 6B:
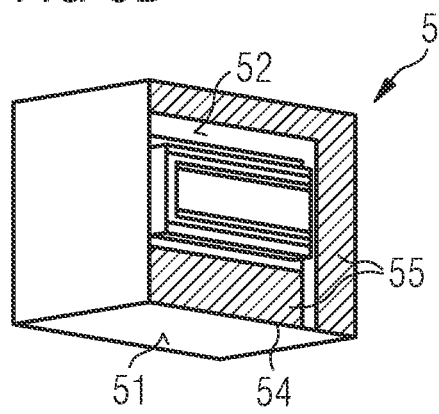
Figure 6C:
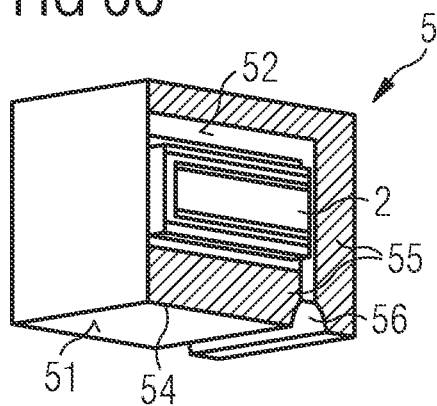
Figure 6D:
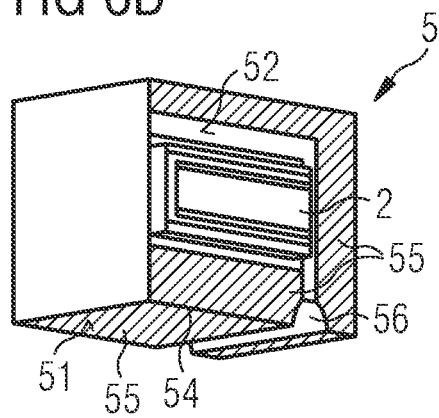

FIGS. 6A to 6D show various embodiments of the carrier element 5, wherein the carrier element 5 shown in FIG. 6A corresponds to the embodiment of FIGS. 1A to 1D and the carrier element 5 shown in FIG. 6D corresponds to the embodiment of FIG. 5. FIGS. 6B to 6D also show the mounted semiconductor laser diode 2 (without bond wire connection).

The carrier element 5 shown in FIG. 6A, like the other embodiments, substantially has a cuboid shape with a bottom side 51, side surfaces 52 and a top side 53. With the bottom side 51 the carrier element 5 is mounted on the bottom surface of the housing. The carrier element 5 has a contact layer 55 in the form of a metallization on the top side 53 over the entire surface, which extends to the side surface 52. Furthermore, a corresponding contact layer 55 is also applied to this side surface 52, which is intended for mounting the semiconductor laser diode. This contact layer 55 completely covers the side surface 52 except for an upper region and extends to a bottom edge 54 between the bottom side 51 and the side surface 52. In addition, the contact layer 55 on the side surface 52 can also extend over the bottom edge 54 to the bottom side 51 and also preferably cover this completely. By means of a solder connection or an adhesive bond, the contact layer 55 applied on the side surface can be connected with a contact region of the housing, on which the carrier element is placed, in a particularly preferred electrically conductive way, while the contact layer 55 applied on the top side 53 can be connected with another contact region in an electrically conductive way by means of a wire connection.

In the carrier element 5 shown in FIG. 6B, the bottom side 51 is free of the contact layer, while the contact layer 55 is structured on the side surface 52. The contact to contact regions of the housing can be made via the bottom edge 54.

The carrier element 5 shown in FIG. 6C has, in addition to the previous embodiment, a groove 56 in the bottom side 51, by means of which the contact layer regions on the side surface 52 can be better separated from each other in the area of the bottom edge 54, and also, as explained in connection with FIG. 5, settling over a bulge in the bottom surface of the housing is possible.

The carrier element 5 shown in FIG. 6D has a contact layer 55 on the bottom side 51 in addition to the previous embodiment to facilitate contacting of contact regions of the housing.

The features and embodiments described in connection with the figures can also be combined with one another, even if not all such combinations are explicitly described. Furthermore, the embodiments described in connection with the figures may have alternatively and/or additionally further features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

REFERENCE LIST 1 housing
2 semiconductor laser diode
3 bonding wire
4 optical element
5 carrier element
6 light detector
10 bottom element
11 wall element
12 mounting surface
13 housing recess
14 bottom surface
15 contact region
16 housing material
17 bulge
20 laser light
21 fast-axis
22 slow-axis
23 part
41 light-incoupling surface
42 reflector surface
43 light-outcoupling surface
44 top side
45 bottom side
46 elevation
47 indentation
51 bottom side
52 side surface
53 top side
54 bottom edge
55 contact layer
56 groove
91 lateral direction
92 vertical direction
100 light-emitting device
410 surface normal
411 angle

The invention claimed is:

1. A light-emitting device, comprising
a housing with a mounting surface and a housing recess
in the housing recess a semiconductor laser diode which is intended and embodied to emit laser light in a direction parallel to the mounting surface during operation, and
an optical element which is arranged downstream of the semiconductor laser diode in the beam path of the laser light,
wherein
the semiconductor laser diode is mounted in the housing in such a way that the laser light has a maximum divergence in a plane parallel to the mounting surface,
the optical element comprises a light-incoupling surface, exactly one reflector surface and a light-outcoupling surface,
the optical element is a one-piece housing cover which completely covers the housing recess in which the semiconductor laser diode is located, and
the light-outcoupling surface is part of an outer surface of the optical element opposite the mounting surface, and
the light-incoupling surface, the reflector surface and the light-outcoupling surface are inclined such that the laser light exits the optical element in a direction substantially perpendicular to the mounting surface.

2. The device according to claim 1, wherein the light-outcoupling surface is part of an indentation in a top side of the optical element facing away from the bottom surface and the light-incoupling surface and the reflector surface are part of an elevation in a bottom side opposite the top side.

3. The device according to claim 1, wherein the laser light is reflected at the reflector surface by total internal reflection.

4. The device according to claim 1, wherein the optical element comprises a solid body of a transparent material having outer surfaces forming the light-incoupling surface, the reflector surface and the light-outcoupling surface, and wherein the solid body is free of any undercut.

5. The device according to claim 1, wherein the light-incoupling surface and/or the light-outcoupling surface form a Brewster window.

6. The device according to claim 1, wherein the optical element is essentially polarization-maintaining for the laser light.

7. The device according to claim 1, wherein the light-incoupling surface, the reflector surface and the light-outcoupling surface are the only optically active surfaces of the optical element.

8. The device according to claim 1, wherein a light detector is arranged in the housing and wherein, in operation, a part of the laser light is reflected from the light-incoupling surface onto the light detector.

9. The device according to claim 1, wherein the semiconductor laser diode is mounted on a carrier element, the carrier element is mounted with a bottom side on a bottom surface of the housing, and the semiconductor laser diode is mounted on a side surface adjacent to the bottom side.

10. The device according to claim 9, wherein the carrier element has two electrical contact layers to which the semiconductor laser diode is electrically connected, and wherein the bottom surface has two electrical contact regions, and each of the contact layers of the carrier element is electrically conductively connected to a respective one of the contact regions of the carrier element.

11. The device according to claim 9, wherein each of the contact layers of the carrier element are mounted on one of the contact regions.

12. The device according to one of claim 9, wherein the carrier element has a groove in the bottom side between the contact layers.

13. A light-emitting device, comprising
a housing with a mounting surface and a housing recess
in the housing recess a semiconductor laser diode which is intended and embodied to emit laser light in a direction parallel to the mounting surface during operation, and
an optical element which is arranged downstream of the semiconductor laser diode in the beam path of the laser light,
wherein
the semiconductor laser diode is mounted in the housing in such a way that the laser light has a maximum divergence in a plane parallel to the mounting surface,
the optical element comprises a light-incoupling surface, exactly one reflector surface and a light-outcoupling surface,
the optical element is a one-piece housing cover which completely covers the housing recess in which the semiconductor laser diode is located, and
the light-outcoupling surface is part of an outer surface of the optical element opposite the mounting surface, and
the light outcoupling surface is part of an indentation in a top side of the optical element facing away from the bottom surface and the light-incoupling surface and the reflector surface are part of an elevation in a bottom side opposite the top side.

14. The device according to claim 13, wherein the light-incoupling surface, the reflector surface and the light-outcoupling surface are inclined such that the laser light exits the optical element in a direction substantially perpendicular to the mounting surface.

* * * * *